United States Patent
King

(10) Patent No.: US 6,965,754 B2
(45) Date of Patent: Nov. 15, 2005

(54) SATELLITE POSITIONING SYSTEM RECEIVER WITH REFERENCE OSCILLATOR CIRCUIT AND METHODS THEREFOR

(75) Inventor: Thomas Michael King, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 724 days.

(21) Appl. No.: 09/973,510

(22) Filed: Oct. 9, 2001

(65) Prior Publication Data

US 2003/0068977 A1 Apr. 10, 2003

(51) Int. Cl.[7] .............................. G01S 5/14; H04B 7/185
(52) U.S. Cl. ............... 455/12.1; 342/357.5; 342/357.12
(58) Field of Search ..................... 455/12; 342/357.06, 342/357.12, 357.15, 357.01, 357.09, 357.13, 357.05; 701/213

(56) References Cited

U.S. PATENT DOCUMENTS

| | | | |
|---|---|---|---|
| 4,114,155 | A | 9/1978 | Raab |
| 4,164,036 | A | 8/1979 | Wax |
| 4,291,409 | A | 9/1981 | Weinberg |
| 4,297,657 | A | 10/1981 | Frerking |

(Continued)

FOREIGN PATENT DOCUMENTS

| | | |
|---|---|---|
| DE | 19537923 | 4/1997 |
| DE | 19731702 | 4/1998 |
| EP | 0493784 | 7/1992 |
| EP | 0526040 | 2/1993 |

(Continued)

OTHER PUBLICATIONS

Robert P. Denaro, Navstar GPS Test Results and Eric J. Hoffman, et al.; GPSPAC: A Spaceborne GPS Navigation Set; IEEE Plans 1978 Position Location and Navigation Symposium; Nov. 6–9, 1978; which includes the title page, Table of Contents, pp. 1–6 and pp. 13–20.

M. J. Bordel, et al., Texas Instruments Phase I GPS User Equipment; The Institute of Navigation, Global Positioning System; vol. 1, pp. 87–102.

(Continued)

*Primary Examiner*—Binh Tieu
(74) *Attorney, Agent, or Firm*—Roland K. Bowler II

(57) ABSTRACT

A method in a location enabled mobile wireless receiver having an oscillator, including determining a change in cellular network based frequency error of the oscillator (250), based on a difference (230) between a cellular network based frequency error of the oscillator and a reference cellular network based frequency error (210) of the oscillator, determining a first frequency error of the oscillator by summing (250) a reference satellite positioning system receiver based oscillator frequency error (220) with the change in cellular network based frequency error of the oscillator.

27 Claims, 5 Drawing Sheets

U.S. PATENT DOCUMENTS

| | | |
|---|---|---|
| 4,426,712 A | 1/1984 | Gorski-Popiel |
| 4,797,677 A | 1/1989 | MacDoran et al. |
| 4,870,422 A | 9/1989 | Counselman |
| 4,906,944 A | 3/1990 | Frerking |
| 5,043,736 A | 8/1991 | Darnell |
| 5,148,452 A | 9/1992 | Kennedy et al. |
| 5,175,557 A | 12/1992 | King et al. |
| 5,194,871 A | 3/1993 | Counselman |
| 5,343,209 A | 8/1994 | Sennott |
| 5,365,450 A | 11/1994 | Schuchman |
| 5,384,574 A | 1/1995 | Counselman |
| 5,436,632 A | 7/1995 | Sheynblat |
| 5,654,718 A | 8/1997 | Beason et al. |
| 5,663,734 A | 9/1997 | Krasner |
| 5,663,735 A | 9/1997 | Eshenbach |
| 5,731,786 A | 3/1998 | Abraham et al. |
| 5,786,773 A | 7/1998 | Murphy |
| 5,786,789 A | 7/1998 | Janky |
| 5,841,396 A * | 11/1998 | Krasner ................. 342/357.02 |
| 5,884,220 A | 3/1999 | Farmer et al. |
| 5,889,492 A | 3/1999 | Kurby et al. |
| 5,917,444 A | 6/1999 | Loomis |
| 5,940,027 A * | 8/1999 | Forseth et al. ......... 342/357.06 |
| 5,945,944 A | 8/1999 | Krasner |
| 5,982,324 A | 11/1999 | Watters |
| 6,002,363 A | 12/1999 | Krasner |
| 6,041,222 A | 3/2000 | Horton et al. |
| 6,061,018 A | 5/2000 | Sheynblat |
| 6,064,336 A | 5/2000 | Krasner |
| 6,088,348 A | 7/2000 | Bell |
| 6,097,974 A | 8/2000 | Camp |
| 6,107,960 A | 8/2000 | Krasner |
| 6,111,540 A | 8/2000 | Krasner |
| 6,122,506 A | 9/2000 | Lau et al. |
| 6,133,871 A | 10/2000 | Krasner |
| 6,133,873 A | 10/2000 | Krasner |
| 6,133,874 A | 10/2000 | Krasner |
| 6,208,290 B1 | 3/2001 | Krasner |
| 6,208,292 B1 | 3/2001 | Sih et al. |
| 6,236,354 B1 | 5/2001 | Krasner |
| 6,272,430 B1 | 8/2001 | Krasner |
| 6,327,473 B1 | 12/2001 | Soliman et al. |
| 6,421,002 B2 | 7/2002 | Krasner |
| 6,427,120 B1 | 7/2002 | Garin et al. |
| 6,466,803 B1 | 10/2002 | Gardner |
| 6,522,871 B1 | 2/2003 | Patrick et al. |
| 6,630,872 B1 * | 10/2003 | Lanoue et al. .............. 331/176 |
| 6,684,158 B1 * | 1/2004 | Garin et al. ................ 701/213 |
| 6,816,111 B2 * | 11/2004 | Krasner ................. 342/357.12 |
| 2003/0068977 A1 * | 4/2003 | King .......................... 455/12.1 |
| 2003/0214436 A1 * | 11/2003 | Voor et al. .................. 342/418 |

FOREIGN PATENT DOCUMENTS

| | | |
|---|---|---|
| EP | 0604404 | 6/1998 |
| EP | 0871300 | 10/1998 |
| EP | 1046924 | 10/2000 |
| GB | 2264837 | 9/1993 |
| GB | 2324218 | 10/1998 |
| GB | 2349760 | 11/2000 |
| JP | 8015404 | 1/1996 |
| WO | WO 97/47985 | 12/1997 |
| WO | WO 98/00727 | 1/1998 |
| WO | WO 98/09181 | 3/1998 |
| WO | WO 99/54753 | 10/1999 |

OTHER PUBLICATIONS

Larry L. Horowitz, Analysis Of A Single–Bit Digital Receiver For Carrier And Code Tracking; The Johns Hopkins University—Applied Physics Laboratory; Jul. 1976, Copy No. 59, pp. 5–139.

B. G. Glazer, GPS Receiver Operation; Navigation Journal of the Institute of Navigation; vol. 25, No. 2, Spring 1978; pp. 173–178.

Charles C. Couselman III et al., Miniature Interferometer Terminals For Earth Surveying; Massachusetts Institute of Technology; pp. 139–163.

Charles C. Counselman III et al., Miniature Interferometer Terminals For Earth Surveying; Massachusetts Institute of Technology; pp. 65–85.

Charles C. Counselman III et al., Miniature Interferometer Terminals For Earth Surveying: Ambiguity and Multipath with Global Positioning System; IEEE Transactions on Geoscience and Remote Sensing; vol. GE–19, No. 4, Oct. 1981; pp. 244–252.

Charles C. Counselman III et al., The Macrometer: A Compact Radio Interferometry Terminal For Geodesy With GPS; Macrometrics, Inc.; pp. 1165–1172.

T. Thompson, Performance Of The Satrack/Global Positioning System Trident I Missile Tracking System; The Johns Hopkins University, Applied Physics Laboratory; 1980 IEEE; pp. 445–449.

Mikko Kokkonen, et al., A New Bit Synchronization Method for a GPS Receiver; 2002 IEEE; pp. 85–90.

Charles C. Counselman III et al., Accuracy of Baseline Determination By Mites Assessed By Comparison With Tape, Theodolite and Geodimeter Measurements; EOS; vol. 62, No. 17; Apr. 28, 1981; p. 260.

E.D. Holm and E.E. Westerfield, "A GPS Fast Acquisition Receiver", IEEE 1983 National Telesystems Conference, Feb. 1983.

Bloebaum, Scott; *Low Complexity Assisted GPS Positioning*, T1P1.5/98–440, Sep. 1998.

Enge, P. et al, *Design of the Signal and Data Format for Wide Area Augmentation of the Global Positioning System*, PLANS '96, Apr. 1996, pp. 485–495.

*FCC Acts To Promote Competition & Public Safety in Enhanced Wireless 911 Services*, FCC, Sep. 15, 1999.

Fox, Barry, New Scientist; *Military precision for civilian GPS*; May 11, 1996, p. 22.

Spalding, J.W. et al., *Differential GPS Integrity Monitor*, PLANS '94, Apr. 1994, pp. 225–232.

Zhao, *Mobile Phone Location Technologies*, Proceedings of antenna Symposium '99, Motorola,, Oct. 1999.

* cited by examiner

SATELLITE POSITIONING SYSTEM RECEIVER WITH REFERENCE OSCILLATOR CIRCUIT AND METHODS THEREFOR

FIELD OF THE INVENTIONS

The present inventions relate generally to satellite positioning system receivers, for example, location enabled wireless mobile communication devices having satellite signal receivers, and more particularly to reference oscillator circuits, combinations thereof and methods therefor.

BACKGROUND OF THE INVENTIONS

It is well known that accurate internal reference oscillators in satellite positioning system receivers, for example NAVSTAR GPS and Clonass receivers, reduce satellite signal acquisition times by reducing the Doppler search space. Others have therefore endeavored to provide accurate reference oscillators, especially low cost oscillators, for satellite positioning system receivers. The present inventions also provide accurate reference oscillators suitable for use in mobile wireless communication devices.

U.S. Pat. No. 5,654,718 entitled "GPS Receiver Device And Method For Calibrating A Temperature Uncompensated Crystal Oscillator", for example, discloses the use of stored average characteristic S-curve (Beckmann) data to match reference and GPS oscillator frequencies. U.S. Pat. No. 5,654,718 also discloses storing temperature frequency offset data for subsequent GPS signal acquisition.

U.S. Pat. No. 5,841,396 entitled "GPS Receiver Utilizing A Communication Link" discloses the use of a precision carrier frequency signal from a terrestrial network to generate a reference signal for calibrating a local oscillator used by a GPS receiver to acquire GPS signals. U.S. Pat. No. 6,208,292 entitled "Position Location With Low Tolerance Oscillator" uses a scheme similar to that disclosed in U.S. Pat. No. 5,841,396 except that the oscillator correction signal is frozen when the GPS receiver makes position determinations.

U.S. Pat. No. 6,122,506 entitled "GSM Cellular Telephone And GPS Receiver Combination" discloses the use of a precision carrier frequency signal from a terrestrial network to generate a reference signal for controlling a synthesizer that provides a local oscillator signal to a GPS receiver.

BRIEF DESCRIPTION OF THE DRAWINGS

The various aspects, features and advantages of the present invention will become more fully apparent to those having ordinary skill in the art upon careful consideration of the following Detailed Description of the Invention with the accompanying drawings described below.

DETAILED DESCRIPTION OF THE INVENTIONS

Figure 1:
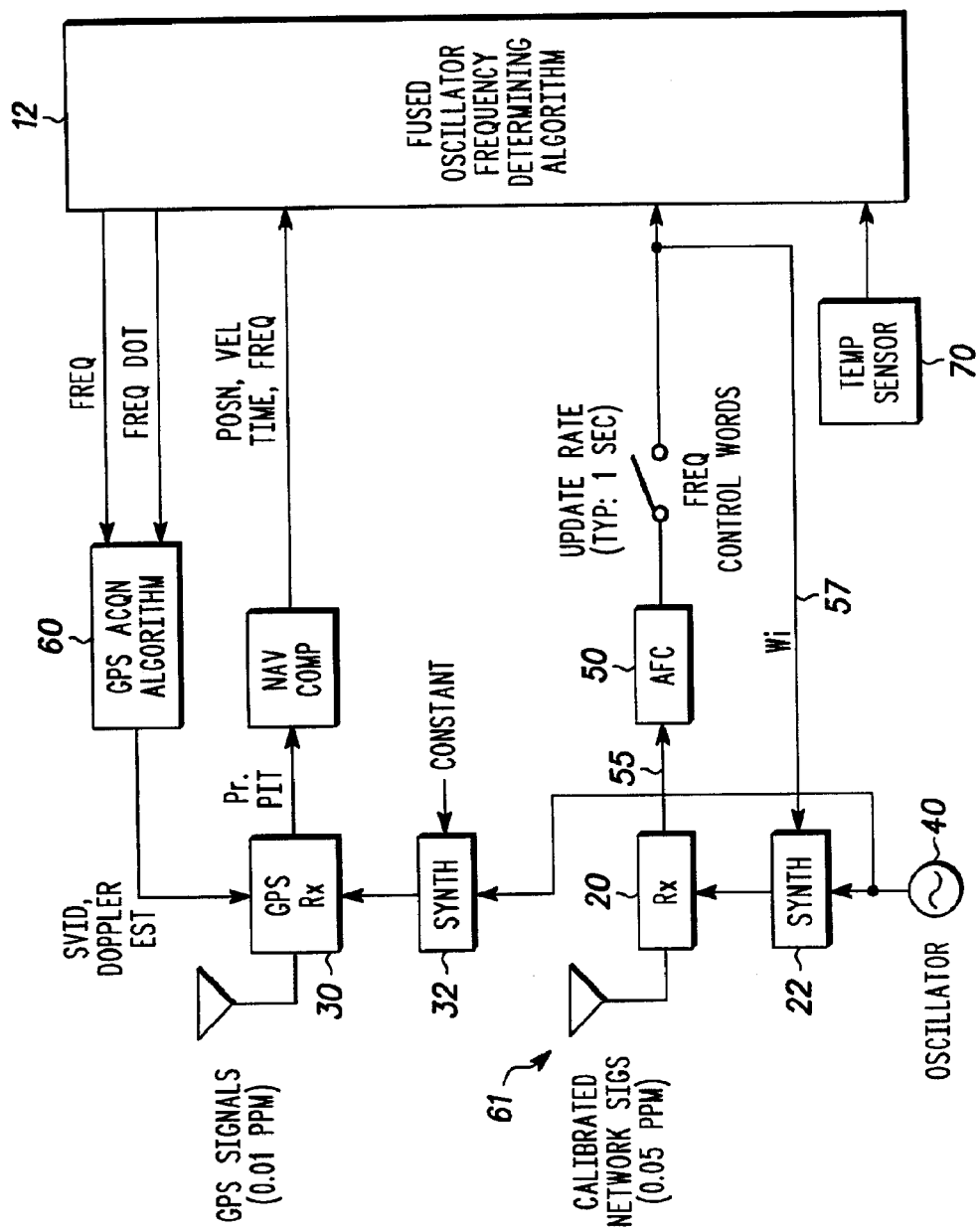
FIG. 1 is a schematic block diagram of an exemplary location enabled mobile wireless communications device.

FIG. 1 illustrates generally a location enabled mobile wireless communication 10 device comprising an RF receiver 20 for receiving signals emitted from a terrestrial or satellite-based communications network, a satellite positioning system receiver 30, which is a GPS receiver in the exemplary embodiment, and a shared oscillator 40. In other embodiments, the oscillator is not shared. The oscillator may be compensated or uncompensated.

The mobile wireless communication device 10 may be a cellular telephone handset, a one-way or two-way pager, a wireless enabled laptop computer, personal digital assistant (PDA), or some other one-way or two-way wireless communication device. The invention is also applicable to location enabled mobile wireless RF receivers integrated with a GPS receiver.

In FIG. 1, the oscillator 40 is coupled to the RF receiver 20 and to the GPS receiver 30 by corresponding synthesizers 22 and 32, respectively. The synthesizers 22 and 32 multiply the oscillator frequency signal 40 by different constants to produce local oscillator reference signals used in traditional down converter receivers 20 and 30. The synthesizers can be programmable in nature; able to generate much different input-to-output frequency multiplication factors such as the case with a fractional-N synthesizer. This is useful to allow for a choice of many possible reference oscillator frequencies for oscillator 40. The synthesizers 22 and 32 can also be fixed in nature, each producing a unique fixed multiplication factor that is optimum for the GPS receiver and the communications receiver. A fixed synthesizer can be accomplished with an integer frequency multiplication, or with a fixed synthesizer such as a phased lock loop formed with a voltage controlled oscillator, fixed divider, phase comparator, and loop filter. For the case of a programmable synthesizer, the synthesizer can be programmable by use of a local microprocessor.

An automatic frequency controller (AFC) 50 receives a frequency error signal 55 from the receiver 20 and provides a frequency tuning control signal to the synthesizer 22, which tends to correct the frequency error measurement at the input to the AFC. The frequency error signal 55 represents the difference between a signal received from the network 61 and the output of the synthesizer 22. The AFC function forms a feedback control loop via path 57 in order to adjust the synthesizer 22 multiplication factor so that the frequency error signal 55 is at or near zero frequency error. The synthesizer multiplication factor is adjustable by a digital frequency control word (Wi) 57. The frequency control word for the synthesizer 22 is generally adjusted by a microprocessor (not shown) or by fixed hardware elements based in the AFC function 50. The typical update rate for adjusting the synthesizer is about 1.2 seconds. Consequently, a series of frequency control words is presented to the synthesizer 22, each control word separated in time from the previous by about 1.2 seconds.

In many communications networks such as cellular telephones and others such as 2 way pagers, the signal transmitted from the network 61 is required to be within a certain frequency range of a target frequency. For example, for terrestrial CDMA cellular telephone systems, the carrier frequency of the signal is required to be within a tolerance of about 0.05 PPM (parts per million) of a target frequency.

The present invention uses precise carrier frequency signals to calibrate the oscillator 40 once the AFC function makes its adjustments to synthesizer 22. That is, as soon as the AFC function adjusts the frequency error signal 55 at or near zero, then the frequency control word Wi programmed into the synthesizer 22 at that time can be used to "know" the absolute frequency of the reference oscillator 40 to the same frequency tolerance, that being 0.05 PPM for a CDMA signal. Since, in some embodiments, the same reference oscillator is used to drive the GPS receiver, the precisely known frequency due to AFC tuning can be used to shorten the frequency search range for acquiring GPS satellites. This reduced frequency search range allows for a reduced GPS signal acquisition time, as disclosed in U.S. Pat. No. 6,122, 506.

A GPS receiver, by itself, has a built-in method of measuring the error in the frequency of a local oscillator when the GPS receiver can acquire enough satellites for a position fix. After the GPS receiver acquires a sufficient number of satellites for fix, a natural output of the navigation solution is the time error of the local clock and the frequency error of that same clock. GPS is one of the best measuring tools of frequency and time error as each satellite signal is based on a composite of several Cesium reference oscillators with a combined stability of about 1 part in $10^{12}$.

Once the GPS receiver locks onto the satellite-transmitted signals and computes position/velocity, the high accuracy and stability of the GPS satellite clock can be translated into knowledge of the GPS receiver's reference oscillator time and frequency offset to approximately the same degree of accuracy (geometry, the received signal levels, receiver thermal noise, noise figure, and implementation losses contribute to a reduction in the measurement accuracy). When a GPS receiver achieves lock on a sufficient number of satellites for a fix, the navigation solution measurement of the frequency offset of the reference oscillator is very accurate, on the order of one or two cycles out of the 1575.42 MHz of the L-band GPS carrier signal. This represents an absolute frequency measurement accuracy that is approximately 0.005 to 0.01 PPM, or five to ten times better than that achievable from a CDMA or any other cellular or wireless communications network reference signal. As such, in a system that can observe both GPS signals and wireless communications network reference signals, the better measurement is obtained directly from GPS itself when GPS is available. When GPS is not available, then the only measurement available is from the wireless communications network reference signal.

A GPS receiver can also measure a frequency error of the reference oscillator when only one satellite is available. The receiver must have knowledge of its approximate location for this to work (say, within 10 km or so) and know time in order to predict the satellite Doppler to the at-least one satellite. When the receiver locks onto one satellite, a measured Doppler to the one satellite is available from the receiver's signal tracking loop. The difference of the predicted and measured Doppler value represents the oscillator-offset frequency if the receiver is stationary. If the receiver is not substantially stationary, then the unknown velocity of the receiver in the direction of the satellite will corrupt the Doppler measurement to the degree of up to 5 Hz per meter per second of velocity. Alternately, if the satellite is nearly overhead, then the Doppler measurement will not be affected by any lateral velocity component and thus it can be used more effectively to predict the reference oscillator offset frequency. It is preferred to use the highest satellite in the sky to minimize the effect of any receiver motion on the Doppler measurement. The receiver can predict the elevation angle of each satellite with a locally stored copy of the satellite almanac or ephemeris data and thus measure the possible reduction in the measured Doppler accuracy given some assumption on the maximum velocity of the receiver will experience.

According to one aspect of the invention, the two measurement sources can work cooperatively in the following manner, without having to use the absolute frequency error information derived from the wireless communications network reference signal. The change in the frequency error measurement as derived from observation of the wireless communications network reference signal is used and added to an absolute frequency error measurement derived from the satellite positioning system receiver.

Figure 2:
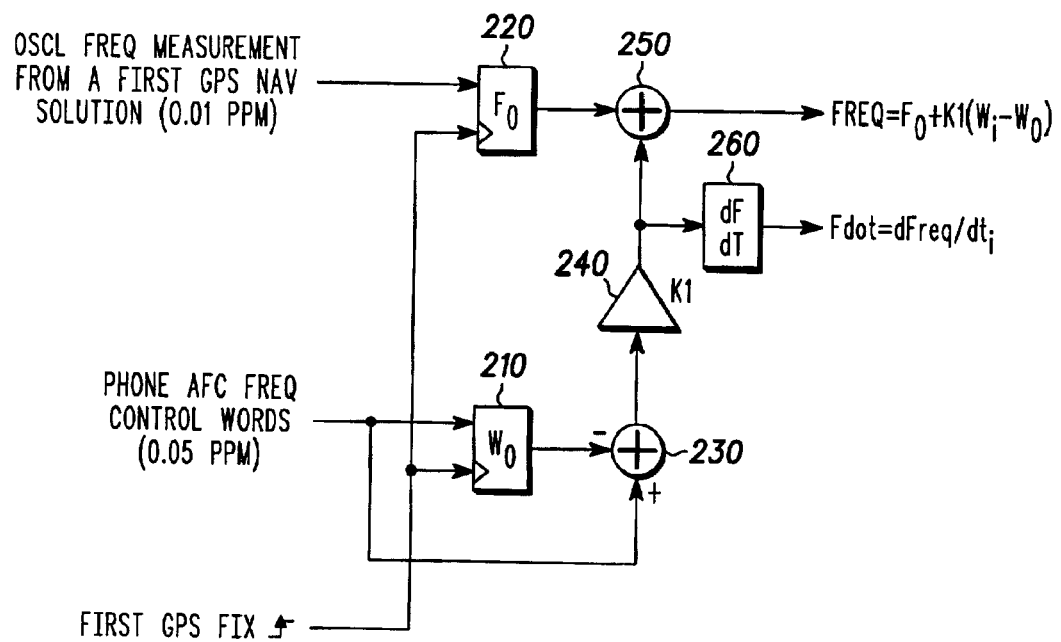
FIG. 2 is a schematic block diagram of an exemplary circuit logic diagram for determining oscillator frequency error.

In one embodiment, illustrated in FIG. 2, an initial or first frequency error is determined by summing a reference satellite positioning system receiver based oscillator frequency error ($F_o$) with a change (deltFreq) in an RF signal based frequency error of the oscillator according to the following expression:

$$\text{Freq}_{ERROR} = F_o + \text{deltFreq} \qquad \text{Eq. (1)}$$

In the exemplary embodiment, the RF signal based frequency error is a cellular network based frequency error, but in other embodiments it could be any other relatively precise RF signal, for example a television or radio broadcast signal.

The variable deltFreq is expressed in terms of an AFC control word, Wi, as follows:

$$\text{deltFreq} = K^*(Wi - W_o)$$

Where $W_o$ is an AFC tuning word corresponding to a reference cellular network based frequency error of the oscillator measured in the past, Wi is an AFC tuning word corresponding to a current cellular network based frequency error of the oscillator, and K is a proportionality factor that converts the AFC tuning or control word quantum steps into units of frequency. Thus in the exemplary embodiment, Equation (1) is expressed as follows:

$$\text{Freq}_{ERROR} = F_o + K^*(Wi - W_o) \qquad \text{Eq. (2)}$$

The reference cellular network based frequency error AFC control word (Wo) and the reference satellite positioning system receiver based frequency error (Fo) are measured at the same time upon determining a satellite positioning system based position fix, for example a first GPS position fix measured at the end of the factory assembly line prior to shipping. The satellite positioning system position fix forms the basis for determining the reference satellite positioning system receiver based frequency error (Fo), and is substantially better than a cellular network infrastructure based oscillator frequency error determination. A GPS based frequency error determination, for example, will be better than one or two carrier cycles out of the 1.575 GHz waveform.

The reference cellular network based frequency error control word (Wo) and the reference satellite positioning system receiver based frequency error (Fo) are preferably stored on the device for subsequent use in determining the frequency error of the oscillator according to Equation (2) over the useful life of the device.

In FIG. 2, the reference cellular network based frequency error AFC control word ($W_o$) is stored at block 210 based upon a CDMA infrastructure signal or other wireless communications network signal, to which the RF receiver must be tuned by better than 0.05 parts per million (PPM). The reference satellite positioning system receiver based frequency error (Fo) is stored at block 220 based on a first GPS position solution. The terms Wo and Fo are measured and stored simultaneously when the GPS first fix is obtained and when the wireless communications network AFC tuning function measurements are available. Fo and Wo are measured at the same time.

In FIG. 2, a subsequent reference cellular network based frequency error AFC control word (Wi) determination is differenced with the reference cellular network based frequency error AFC control word ($W_o$) at 230 and scaled at 240 to determine the change in the wireless network signal based frequency error of the oscillator, which is summed at 250 to determine the current frequency error of the oscillator. In FIG. 1, this information is processed by a processor-based algorithm 12.

The frequency error determined by Equations (1) or (2) may thus be used to compensate the GPS signal acquisition algorithm with precise knowledge of the frequency of the oscillator. The frequency error of the oscillator determined by these equations may be used to acquire satellite positioning system satellites more quickly, for example by a GPS acquisition algorithm at block 60 in FIG. 1. GPS acquisition algorithms are known generally by those having ordinary skill in the art, as disclosed, for example, by Bradford Parkinson et al. in "Global Positioning System: Theory and Applications Volume 1", on page 367. Generally the more accurately that the acquisition algorithm "knows" the reference oscillator frequency, the faster the algorithm can detect the GPS satellite signals because the search space in the Doppler dimension is reduced.

According to another aspect of the invention, a time rate of change of the frequency error is determined and used to aid the GPS satellite acquisition algorithm. In an application in which the reference oscillator 40 is an uncompensated crystal oscillator, the frequency of the reference oscillator can change rapidly as a function of temperature change. For example, if the uncompensated reference oscillator is in a wireless communications device that has been at room temperature for a long time (thermal equilibrium achieved), then the time rate of change of the reference oscillator frequency will be small or zero. If, however, the wireless communications device is moved to a different environment in which the ambient temperature is substantially hotter or colder (example, taking it outside on a hot or cold day), the temperature gradient on the reference oscillator crystal will shift the frequency up or down until thermal equilibrium is again reached. The wireless communications device has a direct observation of the change in frequency due to the temperature gradient on the crystal by observing the sequence of AFC tuning adjustments, that is, the sequence of Wi corrections 57 shown in FIG. 1. The rate of change of the oscillator frequency can be measured by the equation $$dF/dT = K(W_i - W_{i-1})/dT \quad \text{(Eq. 3)}$$

wherein the current Wi control word is subtracted from the previous Wi control word (i.e., $W_{i-1}$) and the difference is multiplied by the constant K discussed above, and then divided by the time interval between the two successive measurements. As mentioned earlier, typical AFC loop updates occur at 1.2 seconds in cellular handsets. In a different embodiment, the AFC function itself can estimate the time rate of change of the frequency directly. In yet another embodiment, the time rate of change of Equation 2 can be measured from time separated estimates. Any of these methods can produce a rate of change of the reference oscillator frequency.

Figure 4:
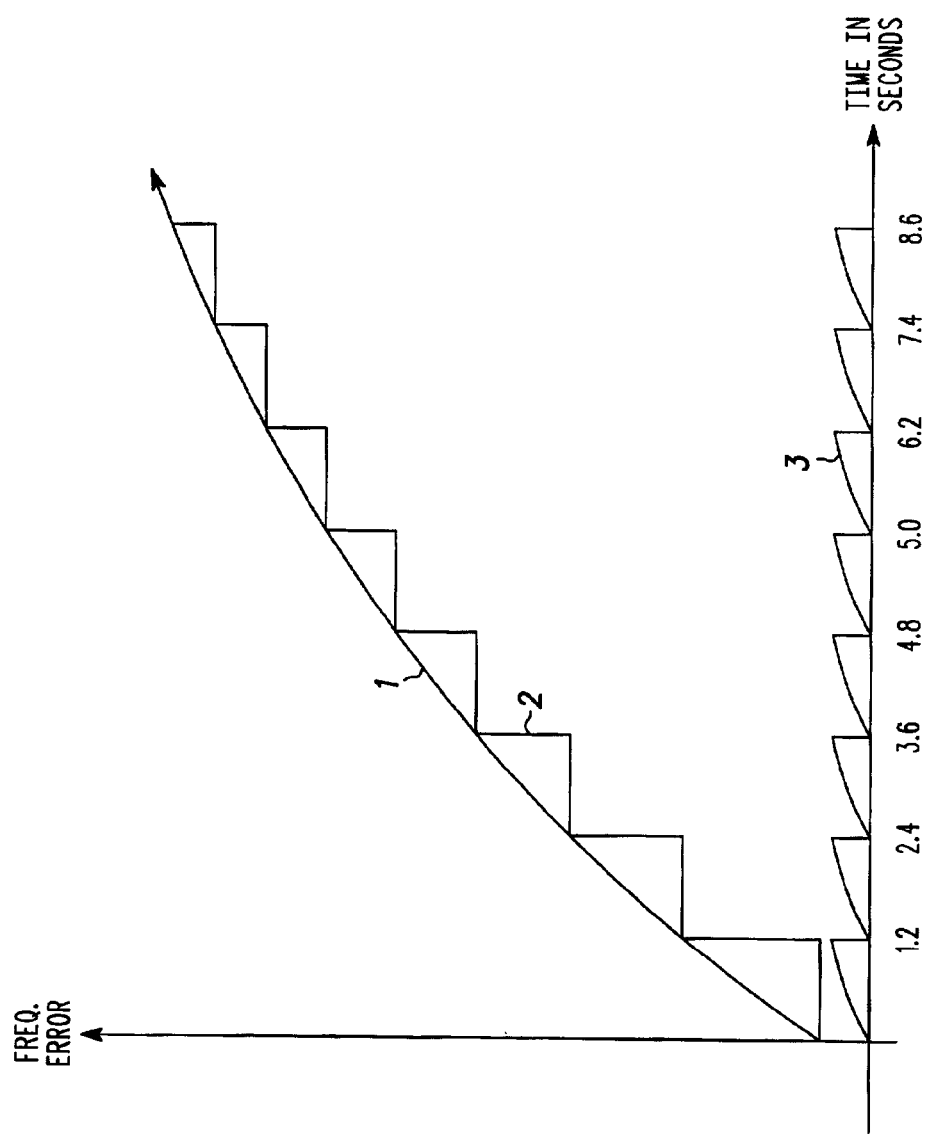
FIG. 4 is a frequency error versus time plot.

FIG. 4 shows a plot of the frequency of an uncompensated crystal oscillator under the case where the crystal temperature is changing. Curve 1 shows the absolute frequency error of the reference oscillator during the condition of a temperature gradient. The absolute frequency offset of the oscillator follows a ramp as described by curve 1. Curve 2 describes the effects of AFC function's 1.2-second update cycle on its ability to estimate and follow the temperature gradient induced ramp on the crystal oscillator output frequency. The AFC function measures an average error between the received network reference signal (61 in FIG. 1) and the oscillator 40. At the 1.2-second rate, the AFC function writes a synthesizer control word Wi, in which the synthesizer is stepped to a different frequency and then held constant until the next 1.2-second cycle is complete. Thus, the output of the synthesizer 22 follows the general shape of curve 1, but does so with a stair-step shape.

In FIG. 4, curve 3 shows the error in the estimate of the reference oscillator frequency based only on measurements of the Wi parameter. The shape of curve 3 follows a saw-tooth pattern in which the error is small just after an AFC adjustment, and grows to a substantial value just before the next adjustment. During rapid heating and cooling of an uncompensated oscillator, the size of the sawtooth peaks, when multiplied up to GPS frequencies, can add tens to hundreds of cycles per second of additional satellite Doppler. Detecting GPS signals with such a periodic sawtooth frequency modulation added to the signal is very difficult. Detecting GPS satellites in weak signal environments requires narrow frequency bandwidth integration with coherent integration periods of 20 milliseconds or more followed by non-coherent integration of up to several seconds. The detection period is longer than the cycle time of the sawtooth, so one or more complete cycles of the sawtooth waveform may be impinged on the signal. The 20-millisecond coherent integration periods have an effective bandwidth of only 50 Hz. Any frequency modulation on the signal of more than +/−25 Hz from the receiver "tuned to" frequency will highly attenuate the signal and make detection difficult or impossible. When the peaks of the sawtooth FM modulation exceed a substantial fraction of 50 Hz (when multiplied to L-band) then the ability of the receiver to detect weak signals is greatly hampered due to the outside-the-bandwidth integration. In addition, demodulation of the Bi-phase 50 BPS satellite-transmitted data sequence is also very difficult as the frequency modulation rotates the Bi-phase signal making it difficult to track. Consequently, a method of smoothing out the sawtooth error function is necessary when using equation 2 and the relatively slow periodic AFC tuning adjustments Wi to predict the uncompensated oscillator frequency.

This is accomplished by using the rate of change of frequency parameter of, Equation 3. The rate-of-change of frequency parameter can be used to stair-step the GPS satellite Doppler NCO frequency estimate at a rate much more rapid than the 1.2-second cycle time of the AFC function. For example, the rate-of-change can be used to step-change the GPS satellite Doppler NCO frequency word at 1-millisecond increments at a rate consistent with the rate-of-change parameter. This allows the GPS satellite Doppler NCO frequency to follow the shape of the original uncompensated reference oscillator (curve 1 in FIG. 4) much more closely and greatly reduces the stair-step action shown on curve 3 of FIG. 4.

Figure 5:
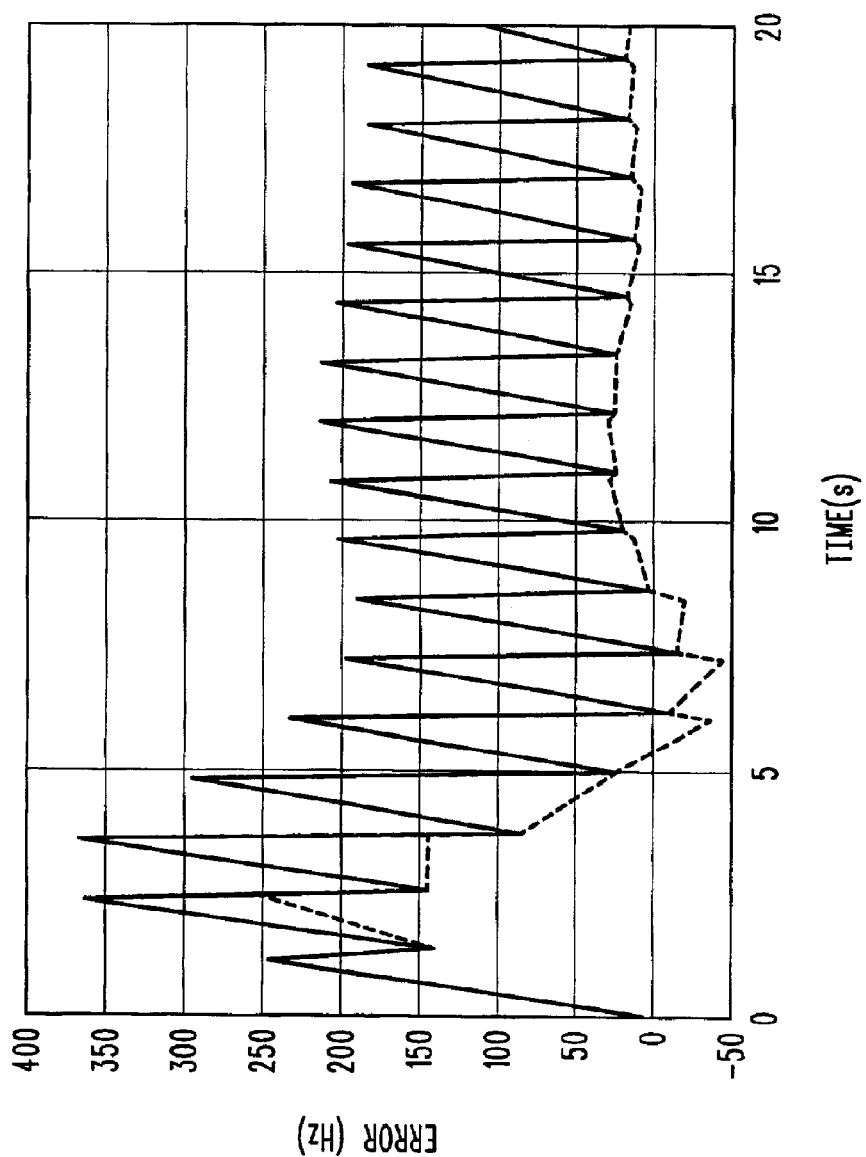
FIG. 5 is a frequency error versus time plot.

FIG. 5 shows the results of this process. Curve 1 of FIG. 5 shows the original sawtooth error pattern; that is, the same as curve 3 of FIG. 4. Curve 2 of FIG. 5 shows the effect of applying the rate-of-change parameter on the composite error curve. As can be seen, the sawtooth pattern is greatly reduced, allowing the frequency error to remain under ten Hz or so with discrete steps of under 2 Hz. The frequency error is the difference between the received signal under the influence of the ramping reference oscillator frequency and the GPS satellite Doppler NCO frequency. Under the condition of curve 2 of FIG. 5, it is possible to track the signal and demodulate the satellite transmitted 50 bit per second biphase modulated data sequence.

It should also be noted that the second derivative of frequency with respect to time could also be included in the formulation of the frequency estimate in order to improve and reduce the errors further. Measuring the rate of change of the rate of change parameter, and including a second-order term in the formulation would accomplish this. However, this has not been deemed necessary. A first order estimator is generally sufficient for GPS when using an uncompensated oscillator.

According to another aspect of the invention, a time rate of change of the frequency error is determined based upon a first frequency error, and thereafter a subsequent frequency error is determined based on the time rate of change of frequency error and first frequency error. In FIG. 2, the time rate of change of the frequency error is determined at block 260, for example by evaluating the time derivative of the first frequency error. The oscillator may thus be compensated based on the frequency error and based on upon time rate of change of the frequency error. The time rate of change of the frequency error may also be used by an acquisition algorithm to acquire satellites more quickly, by driving the Satellite Doppler NCO frequency estimate with a frequency ramp proportional to the time rate of change of the frequency error.

According to another aspect of the invention, the time rate of change of frequency error may be based on a time rate of change of temperature. Thus in FIG. 1, a temperature sensor 70 provides temperature sensor information used by the processor based algorithm 12 or to some other means, which determines a temperature based time rate of change of frequency error of the oscillator.

Figure 3:
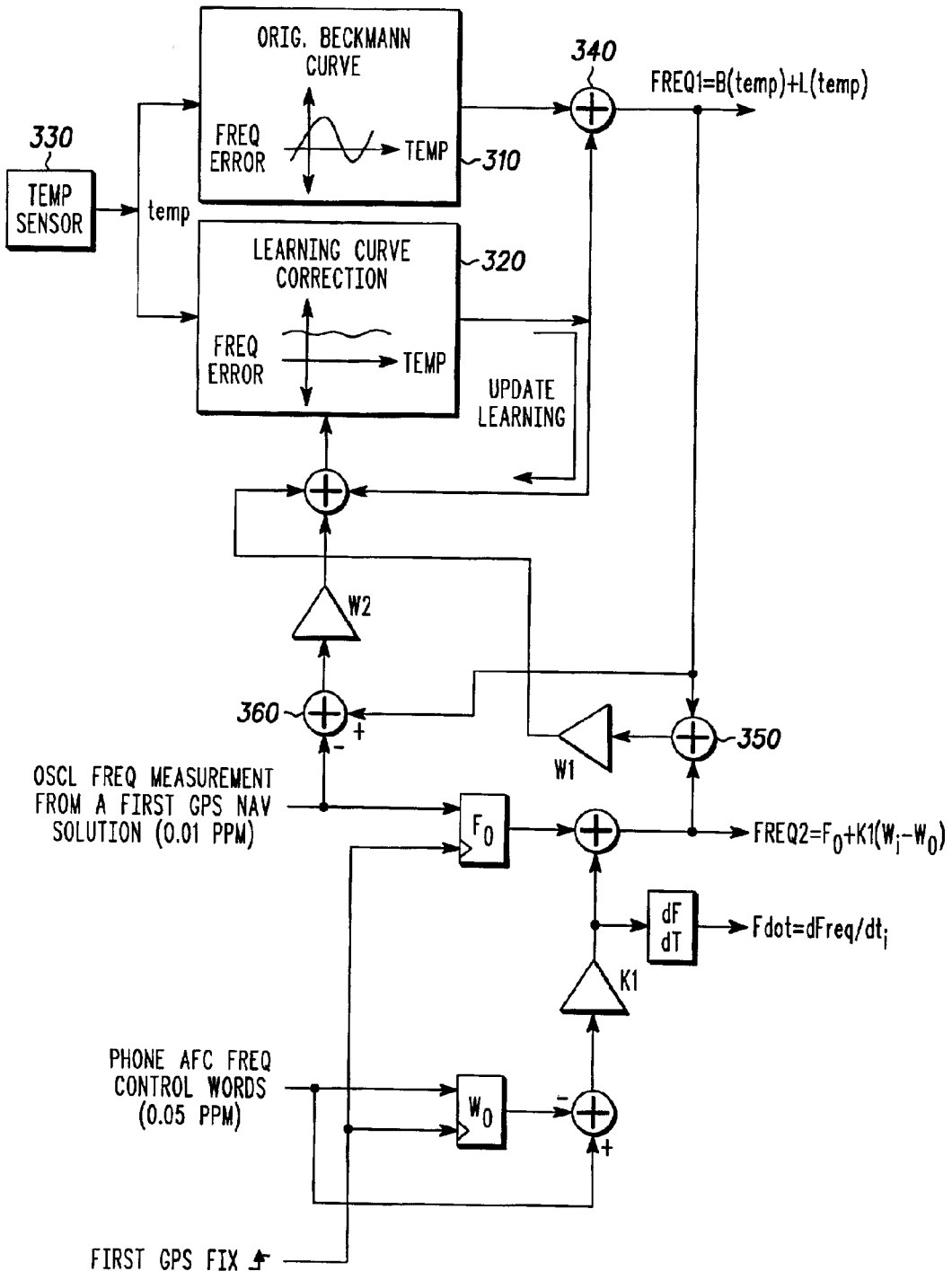
FIG. 3 is another schematic block diagram of an exemplary circuit logic diagram for determining oscillator frequency error.

In FIG. 3, the temperature based time rate of change of the oscillator frequency error is based on Beckmann curve data 310 or temperature versus frequency data for oscillator crystals and/or based on corresponding learning curve data 320, relative to inputs from a temperature sensor 340. Beckmann curve and learning curve data are summed at 340, which is also fed back to update the learning curve data.

In one embodiment, the learning curve date is updated based upon the frequency error measurement data, and in another embodiment the learning curve data is updated based upon satellite positioning system measurement data, either alone or with the frequency error measurement data.

In FIG. 3, for example, the summed Beckmann curve and learning curve data are summed with frequency error data at block 350, and the summed output from adder 350 is used to update the learning curve data. Similarly, the GPS error measurements are summed at block 360, and the corresponding error signal is used to update the learning curve data. The lower portion of FIG. 3 corresponds to that in FIG. 2.

According to another aspect of the invention, the frequency error measurement data and the satellite positioning measurement data used to update the learning curve data is weighted based upon it reliability and/or quality.

Updating the learning curve data based on the AFC tuning word permits updates without the need for GPS location fixes, which is desirable since GPS based location fixes are likely to be few and far between, and in some cases may be updated only when making a 911 call. Also, the AFC tuning word based update of the learning curve data allows for more rapid learning across the entire operating temperature region of the oscillator, thus enabling more rapid time to first location fix at times when network signals are unavailable.

In FIG. 3, for example, the weights $W_1$ and $W_2$ are adjusted to update the learning curve data with GPS measurement data only, or with AFC tuning measurement data only, or with a blend of both. The relative weights may be determined based upon the reliability and/or quality of the GPS location solution and the AFC tuning function. For example, the AFC tuning word may perform poorly in the presence of a weak network signal, which is typical near the service area fringe. Similarly, GPS oscillator frequency measurement is dependent on signal level, satellite geometry and number, multi-path, etc., all of which may be measured to determine the optimal weight attributed to the GPS based learning curve update data.

The frequency error may, for example, be determined by Equations (1) or (2), as discussed above. Alternatively, the frequency error may be determined by some other means, for example any prior art frequency error determination means.

The frequency error of the oscillator, whether compensated or not, may thus be determined based on the temperature based time rate of change of frequency error and a prior frequency error determination. The frequency error of the oscillator may also be determined based on the prior frequency error, the temperature based time rate of change of frequency error, and the time rate of change of frequency error as determined above.

While the present inventions and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the inventions, which are to be limited not by the exemplary embodiments but by the appended claims.

What is claimed is:

1. A method in a satellite position system enabled mobile wireless communication device having an oscillator, comprising:
   determining a change in cellular network based frequency error of the oscillator based on a difference between a cellular network based frequency error of the oscillator and a reference cellular network based frequency error of the oscillator;
   determining a first frequency error of the oscillator by summing a reference satellite positioning system receiver based oscillator frequency error with the change in cellular network based frequency error of the oscillator.

2. The method of claim 1,
   determining the reference cellular network based frequency error and the reference satellite positioning system receiver based frequency error at the same time;
   storing in the mobile wireless communication device the reference cellular network based frequency error and the reference satellite positioning system receiver based frequency error.

3. The method of claim 2, storing the reference cellular network based frequency error by storing a control word associated therewith.

4. The method of claim 2, determining the reference satellite positioning system receiver based frequency error upon determining a satellite positioning system position fix.

5. The method of claim 2, determining the reference satellite positioning system receiver based frequency error upon measuring a satellite positioning system Doppler frequency to at least one satellite.

6. The method of claim 1, the oscillator is an uncompensated oscillator, compensating for an offset frequency of the uncompensated oscillator based on the first frequency error.

7. The method of claim 1, determining a time rate of change of the first frequency error, determining a subsequent frequency error based on the time rate of change of frequency error and the first frequency error.

8. The method of claim 7, compensating for an offset frequency in the oscillator based on a frequency error and based on the time rate of change of the frequency error.

9. The method of claim 1, using frequency error of the oscillator to acquire GPS satellites.

10. The method of claim 1, determining a temperature based time rate of change of the frequency error of the oscillator,
   determining a subsequent frequency error based on the temperature based time rate of change of frequency error and the first frequency error.

11. A method in a location enabled mobile wireless receiver having an oscillator, comprising:
   determining a first frequency error of the oscillator;
   determining a temperature based time rate of change of the frequency error of the oscillator;
   determining a subsequent frequency error based on the temperature based time rate of change of frequency error and the first frequency error.

12. The method of claim 11, determining a temperature based time rate of change of the oscillator frequency error based on Beckmann curve data.

13. The method of claim 11, determining a temperature based time rate of change of the oscillator frequency error based upon stored temperature versus frequency data and stored learning data.

14. The method of claim 11,
   determining a change in an RF signal based frequency error of the oscillator based on a difference between an RF signal based frequency error of the oscillator and a reference RF signal based frequency error of the oscillator;
   determining the first frequency error by summing a reference satellite positioning system receiver based oscillator frequency error with the change in cellular network based frequency error of the oscillator.

15. The method of claim 14,
   determining a time rate of change of the frequency error;
   determining the subsequent frequency error based on the time rate of change of frequency error, the first frequency error, and the temperature based time rate of change of frequency error.

16. The method of claim 15, compensating the oscillator based on a frequency error and based on the time rate of change of the frequency error.

17. The method of claim 15, determining the temperature based time rate of change of oscillator frequency based on Beckmann curve data and learning curve data.

18. The method of claim 17, updating the learning curve data based upon the frequency error measurement data.

19. The method of claim 18, updating the learning curve data based upon satellite positioning system measurement data.

20. The method of claim 19, weighting the frequency error measurement data and the satellite positioning measurement data used to update the learning curve data based upon at least one of reliability and quality of the frequency error measurement data and the satellite positioning measurement data.

21. A method for compensating an oscillator in a satellite positioning system enabled mobile device having an RF receiver, comprising:
   determining a change in RF signal based frequency error of the oscillator based on a difference between an RF signal based frequency error of the oscillator and a reference RF signal based frequency error of the oscillator;
   determining a first frequency error of the oscillator by summing a reference satellite positioning system receiver based oscillator frequency error with the change in RF signal based frequency error of the oscillator.

22. The method of claim 21,
   determining the reference RF signal based frequency error and the reference satellite positioning system receiver based frequency error at the same time upon determining a satellite positioning system position fix of the mobile device;
   storing in the mobile wireless communication device the reference RF signal based frequency error and the reference satellite positioning system receiver based frequency error.

23. The method of claim 21, compensating the oscillator based on the first frequency error.

24. The method of claim 23, determining a time rate of change of the first frequency error, determining a subsequent frequency error based on the time rate of change of frequency error and the first frequency error.

25. The method of claim 24, compensating the oscillator based on frequency error and based on a time rate of change of the frequency error.

26. The method of claim 21, using frequency error of the oscillator to acquire GPS satellites.

27. The method of claim 21, determining a temperature based time rate of change of frequency error of the oscillator,
   determining a subsequent frequency error based on the temperature based time rate of change of frequency error and the first frequency error.

* * * * *